(12) United States Patent
Kuo et al.

(10) Patent No.: US 9,570,311 B2
(45) Date of Patent: Feb. 14, 2017

(54) MODULAR GRINDING APPARATUSES AND METHODS FOR WAFER THINNING

(75) Inventors: Chun-Ting Kuo, Tainan (TW); Kei-Wei Chen, Tainan (TW); Ying-Lang Wang, Tien-Chung Village (TW); Kuo-Hsiu Wei, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 810 days.

(21) Appl. No.: 13/370,946

(22) Filed: Feb. 10, 2012

(65) Prior Publication Data

US 2013/0210321 A1    Aug. 15, 2013

(51) Int. Cl.
*H01L 21/304* (2006.01)
*B24B 37/04* (2012.01)
*B24B 37/00* (2012.01)

(52) U.S. Cl.
CPC ........... *H01L 21/304* (2013.01); *B24B 37/042* (2013.01); *B24B 37/00* (2013.01)

(58) Field of Classification Search
CPC .......... B24B 1/00; B24B 37/00; B24B 37/042; H01L 21/304
USPC ................. 451/41, 54, 60, 66, 69, 285–290; 438/690–693
See application file for complete search history.

(56) References Cited

U.S. PATENT DOCUMENTS

| | | | |
|---|---|---|---|
| 5,460,478 A * | 10/1995 | Akimoto | H01L 21/67781 414/416.03 |
| 5,616,063 A * | 4/1997 | Okumura | B08B 1/04 451/1 |
| 5,816,891 A * | 10/1998 | Woo | B24B 37/04 451/36 |
| 5,957,764 A * | 9/1999 | Anderson | B24B 21/04 451/285 |
| 6,110,011 A * | 8/2000 | Somekh | H01L 21/67161 257/E21.585 |
| 6,343,979 B1 * | 2/2002 | Peltier | B24B 37/345 451/285 |
| 6,347,974 B1 * | 2/2002 | Chandler | B24B 19/226 451/41 |
| 6,632,012 B2 * | 10/2003 | Vogtmann | B01F 5/0614 366/118 |
| 6,910,943 B2 * | 6/2005 | Ishikawa et al. | 451/5 |
| 7,014,540 B2 * | 3/2006 | Nagel | 451/57 |
| 7,118,446 B2 * | 10/2006 | Walsh et al. | 451/5 |
| 7,163,441 B2 * | 1/2007 | Gerber | 451/11 |

(Continued)

FOREIGN PATENT DOCUMENTS

TW        531470        5/2003
TW       201034790     10/2010

OTHER PUBLICATIONS

Office Action dated Jul. 24, 2014 and English translation from corresponding No. TW 101126905.

*Primary Examiner* — Monica Carter
*Assistant Examiner* — Marcel Dion
(74) *Attorney, Agent, or Firm* — Hauptman Ham, LLP

(57) ABSTRACT

Methods of thinning a plurality of semiconductor wafers and apparatuses for carrying out the same are disclosed. A grinding module within a set of grinding modules receives and grinds a semiconductor wafer. A polishing module receives the semiconductor wafer from the grinding module and polishes the wafer. The polishing module is configured to polish the semiconductor wafer in less time than the grinding module is configured to grind the corresponding wafer.

20 Claims, 3 Drawing Sheets

(56) References Cited

U.S. PATENT DOCUMENTS

| | | | |
|---|---|---|---|
| 8,795,032 B2* | 8/2014 | Miyazaki | B24B 37/345 |
| | | | 451/289 |
| 2002/0052169 A1* | 5/2002 | Vepa et al. | 451/11 |
| 2003/0022498 A1* | 1/2003 | Jeong | B24B 37/042 |
| | | | 438/691 |
| 2003/0032292 A1* | 2/2003 | Noguchi | B24B 37/042 |
| | | | 438/692 |
| 2003/0092363 A1* | 5/2003 | Laursen et al. | 451/41 |
| 2004/0012090 A1* | 1/2004 | Basol | H01L 21/2885 |
| | | | 257/755 |
| 2004/0072499 A1* | 4/2004 | Wakabayashi | B08B 1/04 |
| | | | 451/5 |
| 2005/0014456 A1* | 1/2005 | Hoshino | B24B 37/042 |
| | | | 451/41 |
| 2005/0118938 A1* | 6/2005 | Mizomoto et al. | 451/65 |
| 2007/0141954 A1* | 6/2007 | Chen | B24B 41/005 |
| | | | 451/11 |
| 2008/0070488 A1* | 3/2008 | Fujita | B24B 37/04 |
| | | | 451/444 |
| 2009/0270015 A1* | 10/2009 | D'Ambra et al. | 451/28 |
| 2011/0165823 A1* | 7/2011 | Ide et al. | 451/41 |
| 2013/0102227 A1* | 4/2013 | Walsh | B24B 37/013 |
| | | | 451/11 |
| 2013/0130593 A1* | 5/2013 | Kalenian | B24B 49/00 |
| | | | 451/5 |
| 2014/0073224 A1* | 3/2014 | Yamashita | 451/29 |

\* cited by examiner

MODULAR GRINDING APPARATUSES AND METHODS FOR WAFER THINNING

BACKGROUND

Often times in semiconductor wafer fabrication, after completion of various processes a semiconductor wafer has remaining substrate material that must be removed in a backgrinding process. During the backgrinding process, a spindle rotates a grinding wheel, while the substrate is either held stationary or is itself rotated. If there is a substantial amount of substrate to remove, a coarse grinding wheel is used that grinds the substrate to more rapidly remove the substrate material. For more precise control of the amount of substrate to be removed, a fine grinding wheel is used.

Generally after a backgrinding process has taken place, the semiconductor wafer then is polished and cleaned. In some systems, a single spindle is used to perform the coarse grinding, fine grinding and polishing processes sequentially. However, the coarse grinding often takes the greatest amount of time and creates a timing choke point, as the wafers can only be processed as quickly as the coarse grinding process can be performed. Other systems activate a polishing module to polish the wafer in place, but this too can only be carried out as quickly as the backgrinding process can be performed.

BRIEF DESCRIPTION OF THE DRAWINGS

One or more embodiments are illustrated by way of example, and not by limitation, in the figures of the accompanying drawings, wherein, wherever possible, elements having the same reference numeral designations represent like elements throughout. The accompanying drawings are incorporated herein and are part of this disclosure.

DETAILED DESCRIPTION

The following disclosure provides many different embodiments, or examples, for implementing different features described below. Specific examples of components and arrangements are described below to simplify the present disclosure. These are, of course, merely examples and are not intended to be limiting. For example, various features may be arbitrarily drawn in different scales for simplicity and clarity.

Grinding and polishing modules are described below that decouple the timing of grinding and polishing processes during wafer fabrication and thus increase the number of wafers that can be processed in a given amount of time. A modular approach allows for the combination of grinding and polishing modules to be based on the time needed for each process. Thus, the number of modules in a wafer thinning apparatus is selected for greater efficiency. Additionally, when one module is not functional, the entire process need not be halted for repair. Instead, the single module can be repaired while other modules continue to operate as normal.

Figure 1:
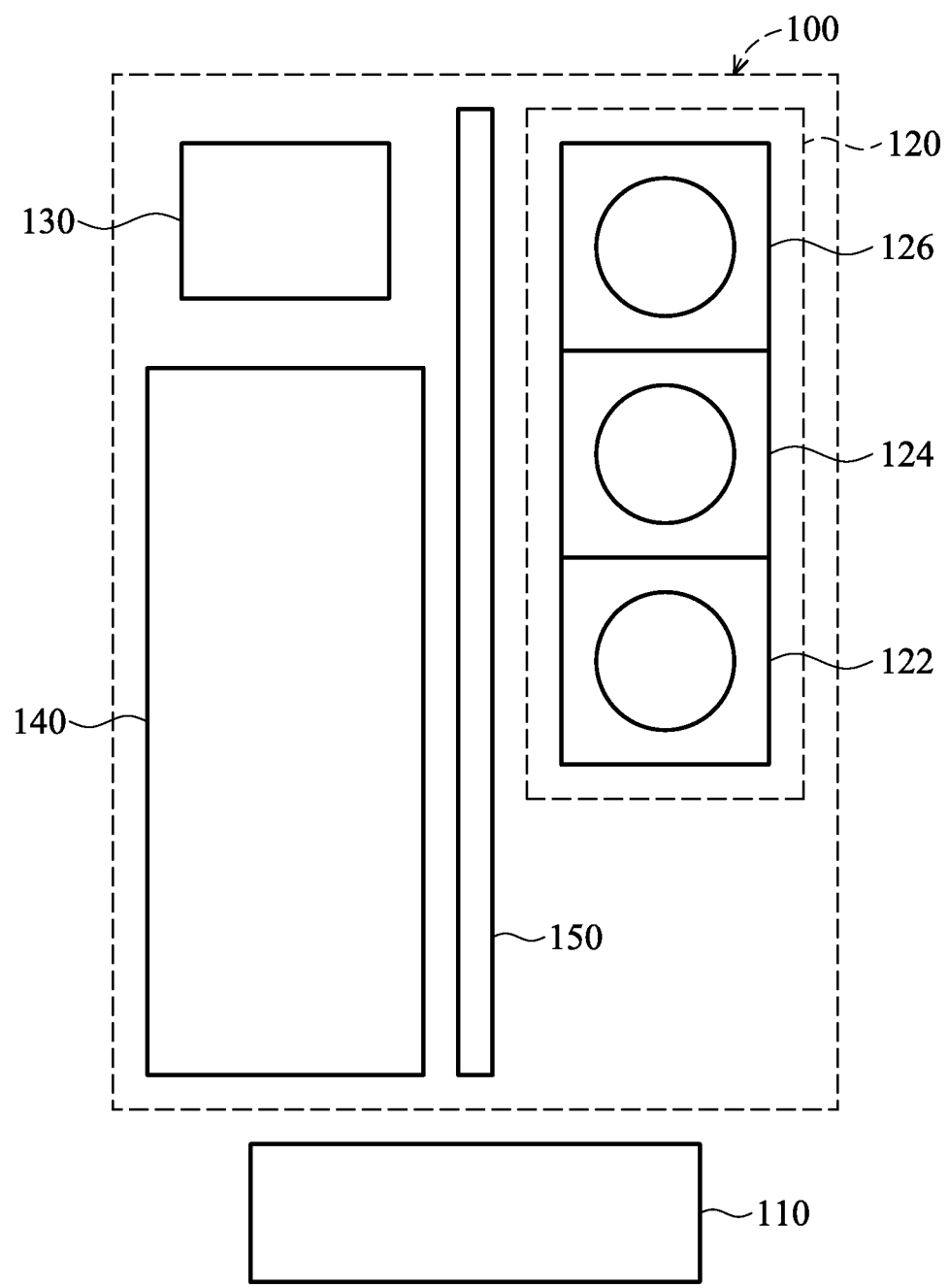
FIG. 1 is a simplified diagram of a wafer thinning apparatus according to an embodiment.

FIG. 1 is a simplified diagram of a wafer thinning apparatus 100 according to an embodiment. The wafer thinning apparatus 100 receives semiconductor wafers from a front opening universal pod (FOUP) 110. The wafer thinning apparatus 100 includes a set of grinding modules 120, a polishing module 130, a cleaning module 140, and a transport mechanism 150.

In at least some embodiments, wafer thinning apparatus 100 receives semiconductor wafers from a mechanism other than a FOUP, e.g., individual wafers or other wafer carrier devices/mechisms.

After processing by wafer thinning apparatus 100, the semiconductor wafers are returned to FOUP 110, to another FOUP for receiving ground and polished wafers, or to any other suitable movement/storage structure.

Transport mechanism 150 is located between grinding module set 120 on one side and polishing module 130 and cleaning module 140 on the other side. In at least some embodiments, transport mechanism 150 is centrally located between grinding module set 120 and polishing module 130 and cleaning module 140. In one configuration, set 120 is physically connected to one side of transport mechanism 150, while polishing module 130 and cleaning module 140 are physically connected to an opposite site. In another configuration, grinding module set 120, polishing module 130, cleaning module 140, and transport mechanism 150 are each attached to a central frame or structure. In alternative embodiments, transport mechanism 150 is located beside an inline arrangement of grinding module set 120, polishing module 130, and cleaning module 140. Other configurations and arrangements of the structural elements of wafer thinning apparatus 100 are contemplated within the scope of this disclosure and the present disclosure should not be construed to cover only the structural arrangements described above.

The set of grinding modules 120 in wafer thinning apparatus 100 includes grinding modules 122, 124, and 126. In at least some embodiments, set 120 includes a greater or a lesser number of grinding modules. Each of grinding modules 122, 124, and 126 perform both coarse grinding and fine grinding processes. The same spindle is used for both backgrinding processes, i.e., coarse or fine, such that the wafer remains in place while being ground. Alternative embodiments further divide the modules for coarse and fine grinding processes. While three grinding modules are shown in set 120, there may be a greater or lesser number of grinding modules utilized. In at least some embodiments, the number of grinding modules utilized is selected based on the processing times involved.

Polishing module 130 is arranged to receive semiconductor wafers from the set of grinding modules 120 through transport of the wafer by transport mechanism 150. Cleaning module 140 is configured to receive wafers from polishing module 130 through transport of the wafer by transport mechanism 150. In at least some embodiments, polishing module 130 processes wafers in one-third or less of the amount of time required for a grinding module in set 120 to process a wafer. In at least some embodiments, cleaning module 140 also processes wafers in one-third or less of the amount of time required for a grinding module in set 120 to process a wafer.

Therefore, the wafers are sequentially processed by placing a first wafer, a second wafer, and a third wafer in corresponding modules of the set at intervals of one-third of the amount of time the grinding process is performed. Once one wafer is processed by one module of set 120, it can be moved by transport mechanism 150 to polishing module 130 for further processing, while the other two wafers are still being processed by corresponding grinding modules.

For example, in some embodiments grinding modules 122, 124, and 126 each grind a semiconductor wafer in about 5 minutes, or 300 seconds. Polishing module 130 polishes a wafer in approximately 100 seconds, while cleaning module 140 cleans a wafer in approximately 60-100 seconds. A first wafer is placed in module 122 at a first time denoted $t_0$. A second wafer is placed in module 124 at a time 100 seconds after $t_0$, and a third wafer is placed in a module 126 200 seconds after $t_0$. After 300 seconds after $t_0$, the first wafer is polished for 100 seconds and a fourth wafer can be placed in the module 122. At 400 seconds after $t_0$, a second wafer is polished and a fifth wafer is placed in module 124, while the first wafer is cleaned. At 500 seconds after $t_0$, the third wafer is polished and a sixth wafer is placed in module 126, while the second wafer is cleaned. Thus, more efficient processing time is enabled as a subsequent wafer finishes the grinding/polishing/cleaning process every 100 seconds.

In some embodiments, transport mechanism 150 has a single robotic arm that moves wafers from FOUP 110 to respective grinding modules, polishing module 130, and/or cleaning module 140. The robotic arm has a single control unit to coordinate movement of wafers. In alternative embodiments, transport mechanism 150 is a dedicated robotic arm at each module 122/124/126 to move wafers from FOUP 110 to a corresponding grinding module 122, 124, or 126. Movement from grinding module 122, 124, or 126 to the polishing module 130 is performed by the same robotic arm used to place the wafer in its grinding module. In at least some embodiments, another robotic arm transports the wafer to the grinding module.

Alternatively, one arm moves a wafer from FOUP 110 to a grinding module in set 120, while another arm moves the wafer from the grinding module to the polishing module 130. As the wafers are sequentially processed with a single polishing module 130 and a single cleaning module 140, transport mechanism 150 is configured to move the wafers from polishing module to cleaning module by a single mechanism (e.g., another robotic arm dedicated only to this task, by a conveyor-type system, etc.). Movements are coordinated by a single control unit or independently controlled. Other embodiments for movement from module to module are possible and are considered within the scope and spirit of the present disclosure.

Figure 2:
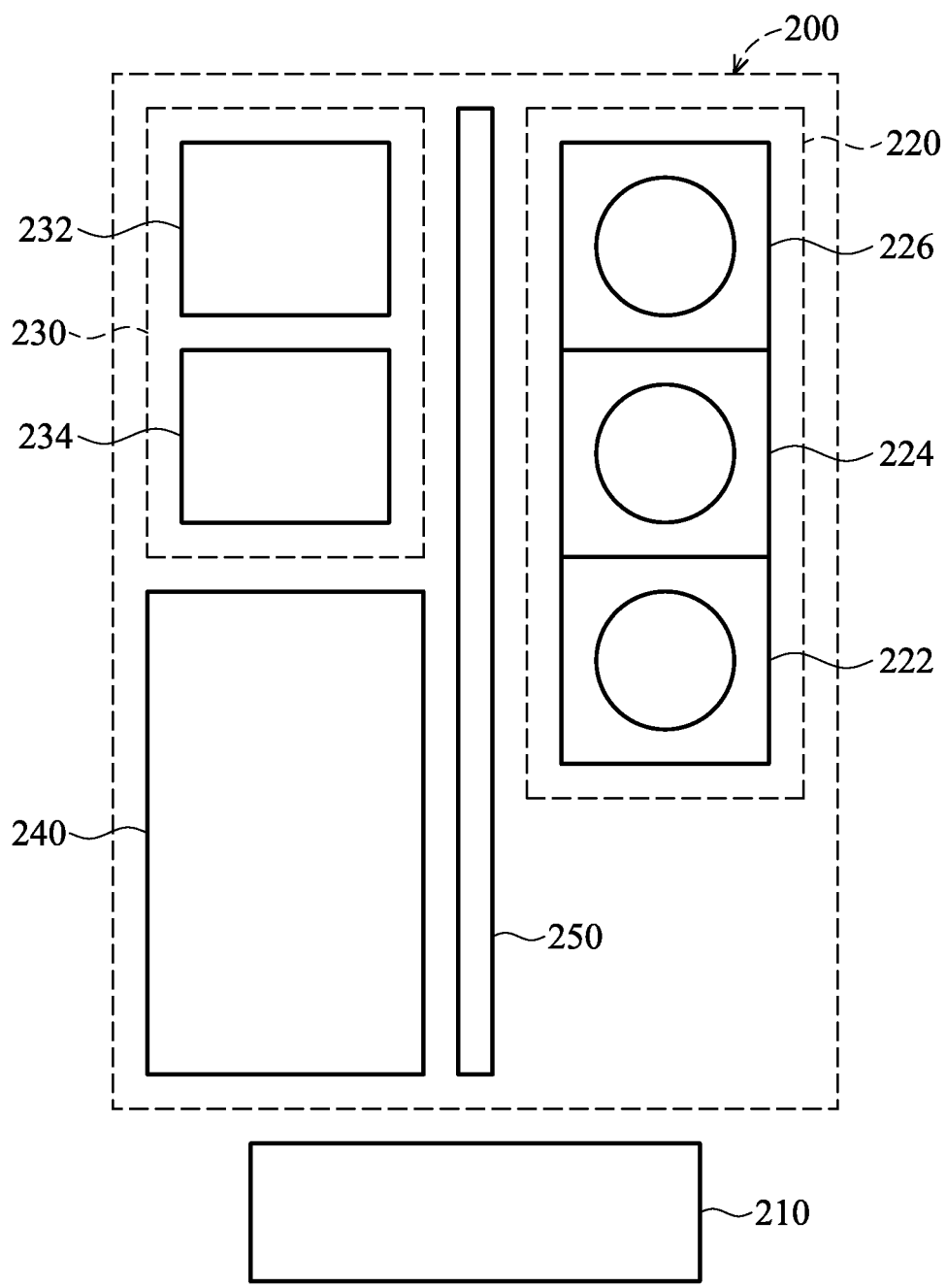
FIG. 2 is a simplified diagram of another wafer thinning apparatus according to an embodiment.

FIG. 2 is a simplified diagram of a wafer thinning apparatus 200 according to an embodiment. The wafer thinning apparatus 200 receives semiconductor wafers from a FOUP 210. The wafer thinning apparatus 200 includes a set of grinding modules 220, a set of polishing modules 230, a cleaning module 240, and a transport mechanism 250. After processing by wafer thinning apparatus 200, the semiconductor wafers are returned to FOUP 210 or to another FOUP for receiving ground and polished wafers.

The set of grinding modules 220 includes grinding modules 222, 224, and 226. Set 220 is similar to set 120 and thus will not be further described other than to confirm that, like grinding modules 122-126, grinding modules 222, 224, and 226 all perform coarse and fine backgrinding and take a greater amount of time to process wafers than subsequent processes in wafer thinning apparatus 200. Cleaning module 240 is also similar to cleaning module 140 and will not be further described.

Set of polishing modules 230 includes polishing modules 232 and 234. In embodiments, polishing modules 232 and 234 each take longer than one-third of the amount of time to grind a semiconductor wafer in order to polish a wafer. Thus, a single polishing module in set 230 does not process semiconductor wafers received from the three grinding modules sequentially as shown above in FIG. 1. In embodiments, polishing module 232 and polishing module 234 each take two-thirds of the amount of time to polish a wafer as a grinding module in set 220 takes to grind a wafer. As a result, polishing module 232 and 234 alternate receiving ground wafers from grinding modules 222, 224, and 226.

For example, in some embodiments grinding modules 222, 224, and 226 each grind a semiconductor wafer in about 5 minutes, or 300 seconds. Polishing modules 232 and 234 polish wafers in approximately 150 seconds, while cleaning module 240 cleans a wafer in approximately 60-100 seconds. A first wafer is placed in module 222 at a first time, denoted $t_0$. A second wafer is placed in module 224 at a time 100 seconds after $t_0$, and a third wafer is placed in a module 226 200 seconds after $t_0$. The first wafer is moved to polishing module 232 300 seconds after $t_0$, the second wafer is moved to polishing module 234 400 seconds after $t_0$ and the third wafer is moved to polishing module 232 500 seconds after $t_0$ (as the first wafer already has been moved to cleaning module 240). Again, subsequent wafers are then being background while the first set of wafers is being processed by the polishing modules and cleaning module, enabling more efficient processing time.

In alternative embodiments, each module in set of grinding modules 220 grinds a semiconductor wafer in 400 seconds. If polishing modules 232 and 234 polish wafers in approximately 150 seconds as described above, the grinding time is more than twice but less than three times the polishing time. In an embodiment, a fourth grinding module 228 is added such that the polishing modules 232 and 234 each receive wafers from exactly two grinding modules (i.e. polishing module 232 is configured to receive wafers from grinding modules 222 and 224, polishing module 234 figured to receive wafers from grinding modules 226 and 228). Cleaning module 240 in this instance may still be able to process in less time and process wafers polished by both polishing modules in set 230.

In other embodiments, the amount of time for movement between modules is factored into the selection of how many grinding modules and how many polishing modules are used. The above numbers in each of set 220 and set 230 are merely exemplary and other configurations of modules may be used. As described above, various configurations of movement of the wafers within the apparatus are contemplated. Transport mechanism 250 comprises some combination of dedicated and/or shared robotic arms. Likewise, in alternative embodiments, transport mechanism 250 is a single control unit configured to coordinate wafer movement through the wafer thinning apparatus 200. In one or more other embodiments, the wafer movement from point-to-point is independently processed and controlled at each stage.

Figure 3:
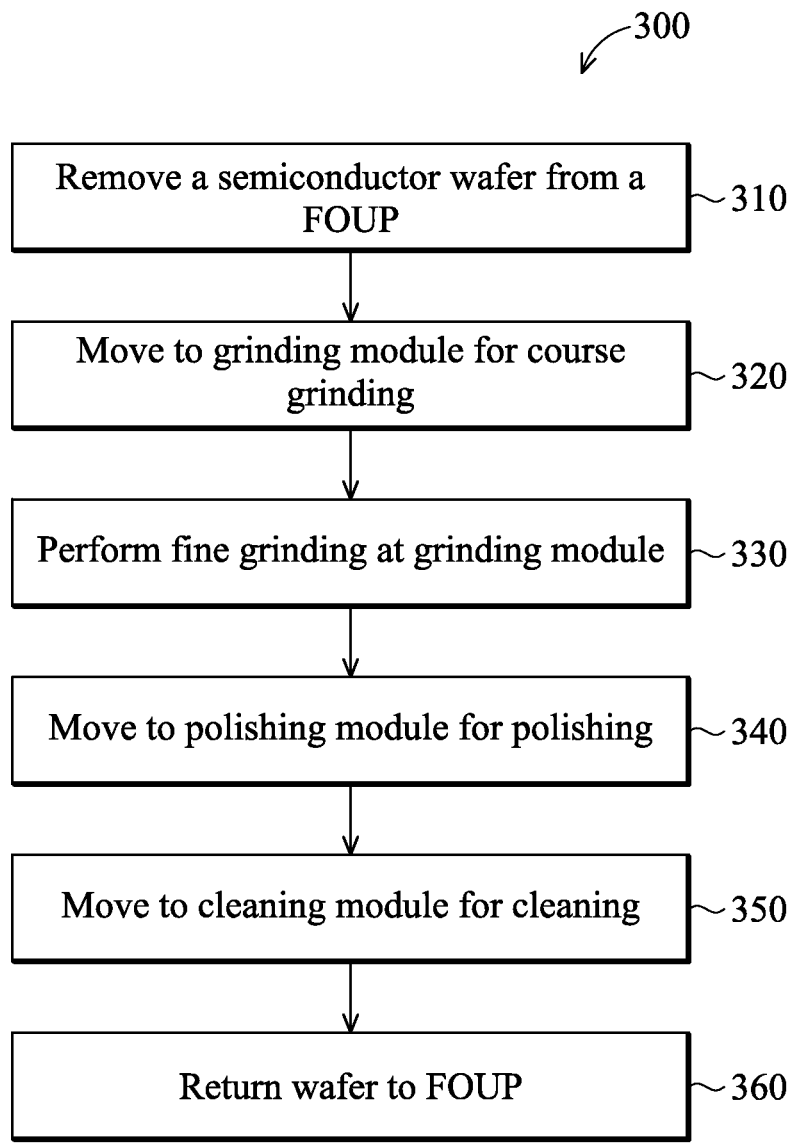
FIG. 3 is a flowchart of a method of thinning semiconductor wafers according to an embodiment.

FIG. 3 is a flowchart of a method 300 of grinding semiconductor wafers according to embodiments. At a step 310, a semiconductor wafer is removed from a FOUP, such as FOUP 110 or 210 described above, and received at a grinding module among a set of grinding modules. While configurations of grinding modules can vary (such as shown in set 120 or set 220 above), at least two grinding modules are in the set of grinding modules.

At a step 320, the semiconductor wafer is ground with a coarse grinding tool at the grinding module. At a step 330, the semiconductor wafer is ground with a fine grinding tool at the grinding module. Steps 320 and 330 may be performed on the same spindle. Alternatively, a separate spindle for each may be utilized.

At a step 340, the semiconductor wafer is moved to a polishing module and polished at the polishing module. The polishing process of step 340 takes less time to complete than the combination of grinding steps at steps 320 and 330. In some embodiments, step 340 takes less than half the combined time of steps 320 and 330. In other embodiments, step 340 takes less than one-third the combined time of steps 320 and 330.

At a step 350, the wafer is moved from the polishing module to a cleaning module for cleaning and is cleaned. At a step 360, the semiconductor wafer is returned to a FOUP. The wafer is returned to the FOUP from which it was received (e.g., FOUP 110 or 210) or to another FOUP for receiving ground and polished wafers.

Various configurations of movement of the wafers during the method 300 are contemplated. Some combination of dedicated and/or shared robotic arms or other movement mechanisms are used to move each wafer during the method 300. Likewise, a single control unit coordinates wafer movement during the method 300, or alternatively, the wafer movement from point-to-point is independently carried out at each stage.

A method of thinning a set of semiconductor wafers is disclosed. The method comprises grinding a semiconductor wafer with a coarse grinding tool at a grinding module amongst a set of grinding modules. The semiconductor wafer is ground with a fine grinding tool at the grinding module. The semiconductor wafer is moved to a polishing module. The polishing module receives semiconductor wafers from more than one grinding module in the set of grinding modules. The semiconductor wafer is polished at the polishing module. The polishing module processes the semiconductor wafer in less time than the grinding module.

Also disclosed is an apparatus for thinning semiconductor wafers. The apparatus includes a set of grinding modules for grinding semiconductor wafers. The apparatus also includes at least one polishing module for polishing the semiconductor wafers. The polishing module is configured to receive wafers from at least one grinding module in the set of grinding modules. A cleaning module for cleaning the semiconductor wafers is configured to receive semiconductor wafers from the at least one polishing module.

An apparatus for thinning semiconductor wafers is further disclosed. The apparatus includes a set of grinding modules for grinding semiconductor wafers. The apparatus also includes a set of polishing modules configured to receive the semiconductor wafers from the set of grinding modules and to polish the semiconductor wafers. Each polishing module of the set of polishing modules is configured to polish a semiconductor wafer in less time than a grinding module of the set of grinding modules is configured to grind a corresponding semiconductor wafer. At least one cleaning module is configured to receive the semiconductor wafers from the set of polishing modules and to clean the semiconductor wafers.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of thinning a set of semiconductor wafers, the method comprising:

placing a semiconductor wafer in a grinding module of a grinding assembly using a first robotic arm;

grinding the semiconductor wafer with a coarse grinding tool at the grinding module amongst a set of grinding modules of the grinding assembly, wherein the set of grinding modules includes at least three grinding modules;

grinding the semiconductor wafer with a fine grinding tool at the grinding module;

moving the semiconductor wafer to a set of polishing modules using a second robotic arm different from the first robotic arm, wherein each polishing module of the set of polishing modules receives semiconductor wafers directly from each grinding module in the set of grinding modules, and the set of polishing modules includes at least two polishing modules; and polishing the semiconductor wafer at the polishing module, wherein the polishing module processes the semiconductor wafer in about one-third of a time taken by a grinding cycle of the grinding module of the set of grinding modules.

2. The method of claim 1 further comprising:

grinding at least one or more additional semiconductor wafers with a coarse grinding tool at a corresponding additional grinding module amongst the set of grinding modules;

grinding the at least one or more additional semiconductor wafers with a fine grinding tool at the corresponding additional grinding module;

moving the at least one or more additional semiconductor wafers to the polishing module; and polishing the at least one or more additional semiconductor wafers at the polishing module.

3. The method of claim 2 further comprising cleaning the semiconductor wafers subsequent to the polishing.

4. The method of claim 3 further comprising returning the semiconductor wafer to a front opening universal pod (FOUP).

5. The method of claim 2, wherein a total time for polishing the semiconductor wafers is less than a total time for grinding the corresponding semiconductor wafers.

6. An apparatus for thinning semiconductor wafers, the apparatus comprising:

a set of two or more grinding modules for grinding semiconductor wafers, wherein the set of two or more grinding modules comprises a module configured to perform coarse grinding;

at least two polishing modules for polishing the semiconductor wafers, wherein each polishing module of the at least two polishing modules is configured to receive semiconductor wafers directly from every grinding module of the set of grinding modules;

a conveyor-type system configured to receive polished semiconductor wafers from the at least one polishing module; and a cleaning module for cleaning the semiconductor wafers configured to receive semiconductor wafers from the conveyor-type system.

7. The apparatus of claim 6, wherein the at least two polishing modules are configured to polish a semiconductor wafer in less time than a grinding module of the set is configured to grind a corresponding semiconductor wafer.

8. The apparatus of claim 6, wherein the at least two polishing modules are configured to receive semiconductor wafers from the at least two grinding modules sequentially.

9. The apparatus of claim 6, wherein the at least two polishing modules are on an opposite side of the conveyor-type system from each grinding module of the set of two or more grinding modules.

10. The apparatus of claim 6, wherein each of the set of grinding modules includes a tool for coarse grinding and a tool for fine grinding, and wherein the tool for coarse grinding and the tool for fine grinding are utilized by the same spindle.

11. The apparatus of claim 6, wherein the apparatus is configured to receive and return semiconductor wafers from and to a front opening universal pod (FOUP).

12. An apparatus for thinning semiconductor wafers, the apparatus comprising:
a set of grinding modules for grinding semiconductor wafers;
a set of polishing modules configured to receive the semiconductor wafers from the set of grinding modules and to polish the semiconductor wafers, wherein each polishing module of the set of polishing modules is configured to polish a semiconductor wafer in at most one-third of a time taken by a grinding cycle of a grinding module of the set of grinding modules, and each polishing module of the set of polishing modules is configured to receive the semiconductor wafers directly from each grinding module of the set of grinding modules; and
at least one cleaning module configured to receive the semiconductor wafers from the set of polishing modules and to clean the semiconductor wafers.

13. The apparatus of claim 12, wherein each polishing module of the set of polishing modules is configured to receive semiconductor wafers from at least two grinding modules of the set of grinding modules.

14. The apparatus of claim 13, wherein each polishing module of the set of polishing modules is configured to polish a semiconductor wafer in less time than a grinding module of the set of grinding modules is configured to grind a corresponding semiconductor wafer.

15. The apparatus of claim 14, wherein each of the set of grinding modules includes a tool for coarse grinding and a tool for fine grinding, and wherein the tool for coarse grinding and the tool for fine grinding are utilized by the same spindle.

16. The apparatus of claim 15, wherein the apparatus is configured to receive and return semiconductor wafers from and to a front opening universal pod (FOUP).

17. The apparatus of claim 12, further comprising a transfer module between each grinding module of the set of grinding modules and each polishing module of the set of polishing modules.

18. The apparatus of claim 17, wherein the at least one cleaning module is on a same side of the transfer module as the set of polishing modules.

19. The apparatus of claim 12, wherein a first polishing module of the set of polishing modules is configured to polish the semiconductor wafer for a same duration as a second polishing module of the set of polishing modules.

20. The apparatus of claim 12, wherein a number of polishing modules in the set of polishing modules is selected based on a difference between the time to polish the semiconductor wafer using a polishing module of the set of polishing modules and a time to grind the wafer using a grinding module of the set of grinding modules.

* * * * *